United States Patent [19]

Chen et al.

[11] Patent Number: 4,741,799
[45] Date of Patent: May 3, 1988

[54] ANISOTROPIC SILICON ETCHING IN FLUORINATED PLASMA

[75] Inventors: Lee Chen; Gangadhara S. Mathad, both of Poughkeepsie, N.Y.

[73] Assignee: International Business Machines Corporation, Armonk, N.Y.

[21] Appl. No.: 931,909

[22] Filed: Nov. 17, 1986

Related U.S. Application Data

[63] Continuation of Ser. No. 730,988, May 6, 1985, abandoned.

[51] Int. Cl.$^4$ .............. H01L 21/306; B44C 1/22; C03C 15/00; C03C 25/06
[52] U.S. Cl. .................. 156/643; 156/646; 156/657; 156/659.1; 156/662; 204/192.37; 252/79.1; 427/38
[58] Field of Search ............ 156/643, 646, 657, 659.1, 156/662, 345; 252/79.1; 204/192.37; 427/38, 39

[56] References Cited

U.S. PATENT DOCUMENTS

| | | | |
|---|---|---|---|
| 4,431,477 | 2/1984 | Zajac | 156/662 X |
| 4,473,435 | 9/1984 | Zafiropoulo et al. | 156/657 X |
| 4,522,681 | 6/1985 | Gorowitz et al. | 156/643 |
| 4,528,066 | 7/1985 | Merkling, Jr. et al. | 156/657 X |
| 4,529,475 | 7/1985 | Okano et al. | 204/192 E X |
| 4,534,816 | 8/1985 | Chen et al. | 156/345 |

OTHER PUBLICATIONS

Mogab et al., "Anisotropic plasma etching of polysilicon", J. Vac. Sci. Technol., vol. 17, No. 3, May/Jun. 1980, pp. 721–730.

Mathad, G. S., "Review of Single Wafer Reactor Technology...", Solid State Technology, Apr. 1985, pp. 221–225.

Bruce et al., "High Rate Anisotropic Aluminum Etching", J. Electrochem. Soc., vol. 130, No. 6, pp. 1369–1372 (1983).

Primary Examiner—William A. Powell
Attorney, Agent, or Firm—Graham S. Jones, II

[57] ABSTRACT

A method of high rate anisotropic etching of silicon in a high pressure plasma is described. In one embodiment the etching ambient is a mixture of either $NF_3$ or $SF_6$, an inert gas such as nitrogen, and a polymerizing gas such as $CHF_3$ that creates conditions necessary for anisotropy not normally possible with nonpolymerizing fluorinated gases in a high pressure regime. The etch process is characterized by high etch rates and good uniformity utilizing photoresist or similar materials as a mask. The present process may advantageously be used to etch deep trenches in silicon using a photoresist mask.

7 Claims, 1 Drawing Sheet 4,741,799

ANISOTROPIC SILICON ETCHING IN FLUORINATED PLASMA

This application is a continuation of copending application Ser. No. 730,988, filed on May 6, 1985, now abandoned.

BACKGROUND OF THE INVENTION

The present invention relates to the fabrication of integrated circuit devices such as LSI or VLSI semiconductor chips, and more particularly to plasma etch processes designed to define microscopic patterns in such devices.

Many dry etching processes for etching silicon are known, typically involving plasmas in the reactive ion etch (RIE) regime of relatively low pressure, approximately 30-100 microns, and low power density, about 0.01-0.5 watt/cm$^2$. Recently, much attention has been directed in the semiconductor industry to plasma etching using high pressure, 1 torr and above, and high power density, 2-10 watt/cm$^2$, resulting in substantially higher etch rates than previously possible.

In plasma etch processes, two removal components contribute to form the resulting etch profile in the target film: a chemical component, due to the chemical reaction of the plasma generated species with the surface material to be removed, and a physical component, due to the momentum transfer of the charged particles formed in the plasma and accelerated through the sheath to the target material. Plasma etch processes carried out in the high pressure regime are distinguished by the much greater importance of the chemical component in etching than in the low pressure RIE processes.

In the conventional fluorinated gas chemistry, as exemplified by U.S. Pat. No. 4,310,380 to Flamm et al., etching is isotropic in nature, with comparable lateral and vertical etch rates in silicon. In the disclosed process the chemical component of the readily dissociated NF$_3$ ambient is very strong, even in the low pressure RIE type process, where one would normally expect a greater vertical etch rate than lateral rate due to the strength of the physical bombardment. In a high pressure regime, such a gas chemistry will become even more isotropic. While isotropic etching is useful in some silicon etch steps, it is not desirable where deep etching of silicon (3 to 5 microns) of small dimensions is required, such as in isolation trench etching. In such a process, a trench is etched around a transistor or other device which is then filled with a dielectric material to electrically isolate the device. The trench cuts vertically through several layers of differently doped polysilicon or silicon. An etch plasma which uses chlorinated gases to control undercut will undercut each layer a different amount depending on that layer's reactivity with fluorine and chlorine. These and other problems are overcome by the present invention.

SUMMARY OF THE INVENTION

One object of the present invention is to provide an improved plasma etching process for silicon, particularly when multiple silicon layers having different doping characteristics are present.

According to one embodiment of the invention, the etchant gas composition includes three major constituents: the etchant species, for example, NF$_3$ or SF$_6$; an inert gas, such as N$_2$; and a polymerizing gas such as CHF$_3$. Nitrogen trifluoride (NF$_3$) readily dissociates in a plasma releasing free fluorine and fluorine-containing radicals in greater quantities than alternate fluorine sources. It is also much safer than ClF$_3$, BrF$_3$, or IF$_3$ which are potentially explosive gases not suitable in a manufacturing environment. In fact, the extremely rapid dissociation of NF$_3$ in a high pressure plasma proves to cause rather nonuniform etching without the dilution by an inert gas. Nitrogen was found to yield somewhat better uniformity than argon or helium.

The addition of a small amount of a polymerizing gas to the high pressure plasma gives the present process its anisotropic character. The choice of polymerizing gases is determined by the type of mask used. A fluorine-containing gas is preferred for photoresist, aluminum or chromium masks, while a silicon dioxide mask will necessitate the addition of a chlorine-containing gas to the fluorine etchant mixture. In the plasma, the gas will form a polymer which is subsequently conformally deposited on the target surface. In the vertical direction, the polymer is etched away leaving a polymer passivated sidewall. The sidewall is protected from lateral etching and undercutting of the silicon is thus eliminated. In the particular case of trench isolation processing, the etchant species does not attack the sidewall of the differently doped polysilicon and so there is no variable undercut such as that encountered in processes using chlorinated gases to control anisotropy.

DETAILED DESCRIPTION OF THE PREFERRED EMBODIMENTS

Figure 1:
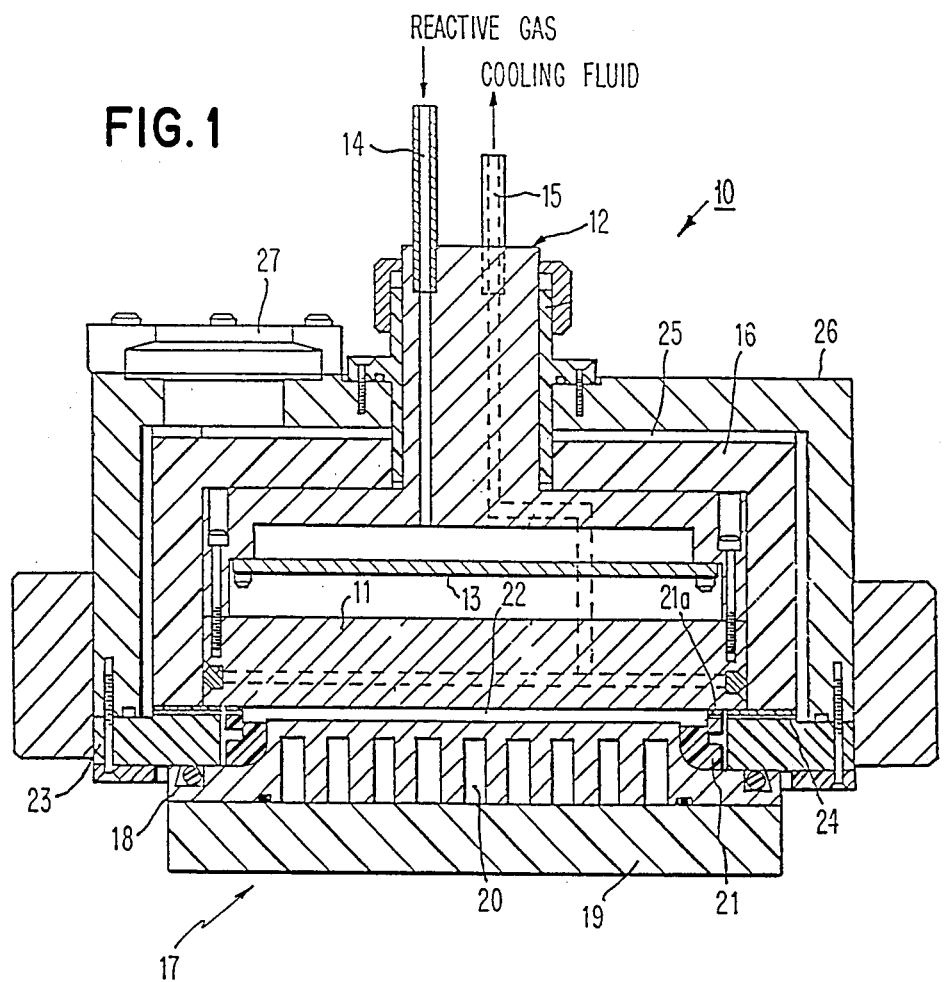
FIG. 1 is a cross-sectional view in elevation of a high pressure single wafer reactor used to practice the process of present invention.

In accordance with the principles of the present invention, etching is performed in a high pressure, high plasma density single wafer reactor of the type shown in FIG. 1. The reactor is similar in design to that described in greater detail in the copending U.S. patent application of Chen et al., Ser. No. 623,670, filed June 22, 1984, now U.S. Pat. No. 4,534,816, which is assigned to the present assignee, and is incorporated herein by reference.

Referring now to the drawings, there is shown in FIG. 1 a single wafer reactor 10, wherein a circular, electrically grounded upper electrode 11 is attached to a cylindrical housing 12. Housing 12 has a gas distributing baffle 13, a reactive gas inlet 14, and a cooling fluid inlet (not shown) and outlet 15. This assembly is contained within an insulating housing 16. The lower electrode 17 includes a conductive upper section 18 and an insulating lower section 19. Upper section 18 includes cooling channels 20 and a raised portion surrounded by an insulating ring 21 having gas exhaust channels 21a. The spacing 22 between the upper 11 and lower 17 electrodes is set at approximately 4 mm. An insulating ring 23, which electrically isolates the two electrodes, is formed of conduits 24 for exhausting the gas from the inter-electrode spacing. These conduits 24 open into a gap 25 between inner housing 16 and outer housing 26. The reacted gases are exhausted from the system through a port 27.

Figure 2:
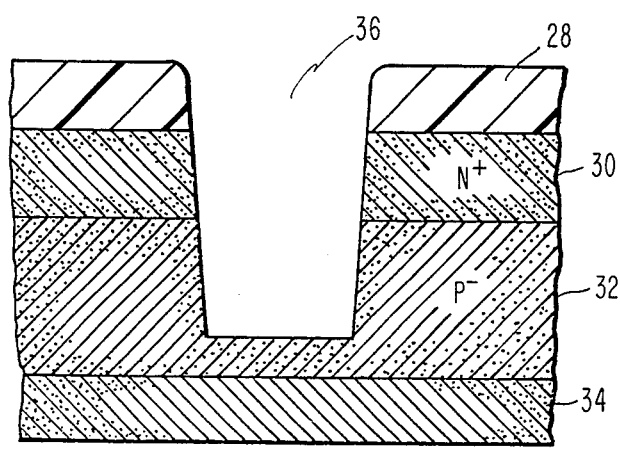
FIG. 2 is a cross-sectional view of a portion of an integrated circuit device etched in accordance with the present invention, specifically, for trench isolation.

FIG. 2 is a greatly enlarged cross-sectional representation of a portion of a silicon wafer showing a trench etched according to the principles of the present invention. A pattern mask layer 28, for example, photoresist, aluminum, chromium or silicon dioxide, is formed on the surface of a heavily n-doped layer 30 of polycrystalline silicon. The mask layer 28, of course, must be resistant to the etching gas mixture. Layer 30 overlies a lightly p-doped monocrystalline silicon layer 32 which is formed on a silicon wafer 34. According to one embodiment of the present invention, the unmasked areas of layers 30 and 32 are etched anisotropically to form a trench 36 having substantially vertical sidewalls. Trench 36 may typically have a width of about 5 microns.

Fluorine-containing polymerizing gases such as $CHF_3$, $C_2F_4$, $C_2F_6$ and $C_3F_8$ have been found to be advantageous in etching silicon or doped polysilicon through photoresist, aluminum or chromium mask layers. It has been found that a silicon dioxide mask layer required, in addition, an amount of a chlorine containing gas such as $CCl_4$, $CFCl_3$, $CF_2Cl_2$ or $C_2HCl_3$, the latter being a halogenated hydrocarbon containing one or more fluorine atoms.

It is to be understood that the specific sequence of doped or undoped layers are illustrative only, and that any sequence or number or layers of undoped polysilicon, doped polysilicon, and monocrystalline silicon may be etched utilizing the principles of this invention.

In accordance with a preferred embodiment of the present invention, a pressure of about 1 torr is established in plasma reactor 10. The etchant gas is introduced at a total flow rate of about 24 SCCM; 10 SCCM of $NF_3$, 10 SCCM of $N_2$, and 4 SCCM of $CHF_3$. In the single wafer reactor, a power density of about 2 watts/cm$^2$ is generated at the wafer surface. The upper electrode 11 temperature is maintained at about 0 degrees C., and the temperature of the lower electrode at about $-10$ degrees C. The silicon wafer is partially masked and placed on the lower electrode 17. For the process conditions specified above, anisotropic etch rates of about 1.6 microns/min. have been observed.

The above example is illustrative only. More generally, etching can be carried out by selecting pressures, total gas flow rates, and power densities in the ranges of 0.5 to 5 torr, 10 to 100 SCCM, and 1 to 10 watts/cm$^2$, respectively.

While the present invention has been particularly shown and described with reference to the preferred embodiments thereof, it will be understood by those skilled in the art that various changes in form and details may be made therein without departing from the spirit and scope of the invention.

What is claimed is:

1. A mehtod of anisotropically etching a silicon body in a single etching step, comprising:

placing said silicon body in a gaseous plasma environment at a constant gas pressure and composition consisting essentially of a chlorine-free fluorine-containing etchant gas, and a polymer-forming gas for substantially limiting lateral etching of said silicon body, said polymer-forming gas consisting of one or more halogenated hydrocarbons wherein the halogen in each is fluorine.

2. The method of claim 1, wherein said etchant gas is selected from the group consisting of $NF_3$, $SF_6$ and the combination thereof.

3. The method of claim 1, wherein said polymer-forming gas comprises $CHF_3$.

4. The method of claim 1, wherein said gaseous plasma environment comprises a pressure of about 1–5 torr and a power density of about 2–5 watts/cm$^2$ at the surface of said silicon body.

5. The method of claim 1, wherein said silicon body to be etched comprises multiple layers of differently doped monocrystalline silicon or polycrystalline silicon or combinations thereof.

6. A method of anisotropically etching a silicon body in a single etching step, comprising:

placing said silicon body in a gaseous plasma environment at a constant gas pressure and composition consisting essentially of an inert gas, and a chlorine-free fluorine-containing etchant gas, and a polymer-forming gas for substantially limiting lateral etching of said silicon body, said polymer-forming gas consisting of one or more halogenated hydrocarbons wherein the halogen in each is fluorine.

7. The method of claim 6, wherein said inert gas comprises nitrogen.

* * * * *